United States Patent
Lai (10) Patent No.: US 10,251,257 B2
(45) Date of Patent: Apr. 2, 2019

(54) ELECTRONIC APPARATUS AND HEAT DISSIPATION AND EMI SHIELDING STRUCTURE THEREOF

(71) Applicant: REALTEK SEMICONDUCTOR CORP., Hsinchu (TW)

(72) Inventor: Chao-Min Lai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 24 days.

(21) Appl. No.: 15/461,939

(22) Filed: Mar. 17, 2017

(65) Prior Publication Data

US 2017/0367175 A1 Dec. 21, 2017

(30) Foreign Application Priority Data

Jun. 15, 2016 (TW) ............... 105118753 A
Jun. 24, 2016 (TW) ............... 105119928 A (51) Int. Cl.
*H05K 1/00* (2006.01)
*H05K 1/02* (2006.01)
(Continued)

(52) U.S. Cl.
CPC ......... *H05K 1/0216* (2013.01); *G06F 1/1656* (2013.01); *G06F 1/182* (2013.01); *H05K 1/02* (2013.01); *H05K 1/0203* (2013.01); *H05K 7/20445* (2013.01); *H05K 9/0024* (2013.01); *H05K 9/0032* (2013.01);
(Continued)

(58) Field of Classification Search
CPC .. H05K 9/0024; H05K 9/0032; H05K 9/0088; H05K 1/02; H05K 1/0203; H05K 1/0216; H05K 2201/066; H05K 2201/10371; H05K 7/20445; H01L 23/552; H01L 2924/3025; G06F 1/182; G06F 1/1656
See application file for complete search history.

(56) References Cited

U.S. PATENT DOCUMENTS

2008/0271875 A1* 11/2008 Lima .................. H01L 21/4882
165/80.3
2013/0016477 A1* 1/2013 Yokoya .................. H01L 23/36
361/719
(Continued)

FOREIGN PATENT DOCUMENTS

TW 201347109 A 11/2013

*Primary Examiner* — Mukundbhai G Patel
*Assistant Examiner* — Zhengfu J Feng
(74) *Attorney, Agent, or Firm* — Li & Cai Intellectual Property (USA) Office (57) ABSTRACT

An electronic apparatus and heat dissipation and EMI shielding structure thereof are provided. The electronic apparatus includes a substrate, at least one chip disposed on the substrate, and the heat dissipation and EMI shielding structure. The heat dissipation and EMI shielding structure covers the chip and includes a shielding frame and a heat dissipation element. The shielding frame has an opening to expose the chip, and the heat dissipation element is disposed on the shielding frame and covers the opening. The conjunction of the shielding frame and the heat dissipation element can protect the chip from being interfered with electromagnetic waves, and the heat generated by the chip can be dissipated by the heat dissipation element.

17 Claims, 5 Drawing Sheets

(51) Int. Cl.
*G06F 1/18* (2006.01)
*G06F 1/16* (2006.01)
*H05K 9/00* (2006.01)
*H05K 7/20* (2006.01)
*H01L 23/552* (2006.01)

(52) U.S. Cl.
CPC .......... *H05K 9/0088* (2013.01); *H01L 23/552* (2013.01); *H01L 2924/3025* (2013.01); *H05K 2201/066* (2013.01); *H05K 2201/10371* (2013.01)

(56) References Cited

U.S. PATENT DOCUMENTS

| | | | |
|---|---|---|---|
| 2013/0307128 A1 | 11/2013 | Lin et al. | |
| 2014/0268578 A1* | 9/2014 | Dolci | H05K 9/0049 361/719 |
| 2015/0282387 A1* | 10/2015 | Yoo | H05K 7/20336 361/700 |
| 2016/0037692 A1* | 2/2016 | Zhang | H05K 1/0203 361/719 |
| 2016/0204575 A1* | 7/2016 | Horn | H01S 5/02272 372/36 |

* cited by examiner

ELECTRONIC APPARATUS AND HEAT DISSIPATION AND EMI SHIELDING STRUCTURE THEREOF

BACKGROUND OF THE INVENTION

1. Field of the Invention

The instant disclosure relates to an electronic apparatus and heat dissipation and EMI shielding structure thereof; in particular, to a thinned heat dissipation and EMI shielding structure and an electronic apparatus using the same.

2. Description of Related Art

In general, portable electronic products include a heat dissipation member for dissipation of the heat generated by each of the electronic devices and an electromagnetic interference (EMI) shield for protecting each of the electronic devices from being interfered with electromagnetic waves which may be generated due to the operations of other electronic devices.

Specifically, the EMI shield completely covers at least one electronic device, and the heat dissipation member is arranged at the outside of the EMI shield to dissipate heat generated by the electronic device covered by the EMI shield. Since the heat dissipation member and the electronic device are isolated and separated from each other, and a gap may exist between the EMI shield and the electronic device, it is not easy to transfer the heat generated by the electronic device to the heat dissipation member located at the outside of the EMI shield. Accordingly, a thermally conductive silicone pad is used to fill the gap between the electronic device and the EMI shield so that the heat generated by the electronic device can be dissipated to the outside of the EMI shield.

However, the thermally conductive silicone pad with higher thermal conductivity is usually too expensive, but still has poorer heat dissipation efficiency than that of metal. Additionally, with the trend of smaller, lighter and thinner portable electronic apparatus, the interior space of the portable electronic apparatus is minimized. However, the overall thickness of the heat dissipation member and the EMI shield is still too thick.

Furthermore, the electronic device may be deformed due to the significant temperature variation during the fabrication process. Accordingly, the top surface of the electronic device is a curved surface instead of a flat surface. That is, the thermally conductive silicone pad attached to an inner surface of the EMI shield cannot be in thermal contact with the center region where the temperature is usually higher than other regions of the electronic device so that the heat dissipation efficiency is not ideal.

SUMMARY OF THE INVENTION

In order to achieve the aforementioned objects, a heat dissipation and electromagnetic interference (EMI) shielding structure and an electronic apparatus using the same are provided in the instant disclosure. The heat dissipation and EMI shielding structure provides a chip with heat dissipation and EMI protection respectively by using a shielding frame having an opening and a heat dissipation element.

A heat dissipation and electromagnetic interference shielding structure is provided in one of the embodiments of the instant disclosure. The heat dissipation and EMI shielding structure for at least one chip disposed on a substrate includes a shielding frame and a heat dissipation element. The shielding frame has an opening to expose the chip. The heat dissipation element is disposed on the shielding frame to cover the opening. The shielding frame is in conjunction with the heat dissipation element to protect the chip from electromagnetic interference, and the heat dissipation element dissipates heat generated from the chip.

According to another embodiment of the instant disclosure, an electronic apparatus is provided. The electronic apparatus includes a substrate, at least one chip disposed on the substrate, and a heat dissipation and EMI shielding structure. The heat dissipation and EMI structure is disposed on the substrate and includes a shielding frame and a heat dissipation element. The shielding frame has an opening to expose the chip. The heat dissipation element is disposed on the shielding frame to cover the opening. The shielding frame is in conjunction with the heat dissipation element to protect the chip from electromagnetic interference, and the heat dissipation element dissipates heat generated from the chip To sum up, the shielding frame has an opening, and the heat dissipation element can be attached to the chip through the opening so that the heat generated from the chip can be directly transferred to outside atmosphere through the heat dissipation element. As such, even without the thermally conductive silicone pad, the heat dissipation and EMI shielding structure of the embodiments of the instant disclosure can dissipate the heat, which results in lower cost. Compared to the conventional heat dissipation member and EMI shield, the overall thickness of the heat dissipation and EMI shielding structure provided in the instant disclosure can be thinner, which provides a benefit for minimizing the size of the portable electronic product.

In order to further the understanding regarding the instant disclosure, the following embodiments are provided along with illustrations to facilitate the disclosure of the instant disclosure.

DETAILED DESCRIPTION OF THE PREFERRED EMBODIMENTS

Figure 1A:
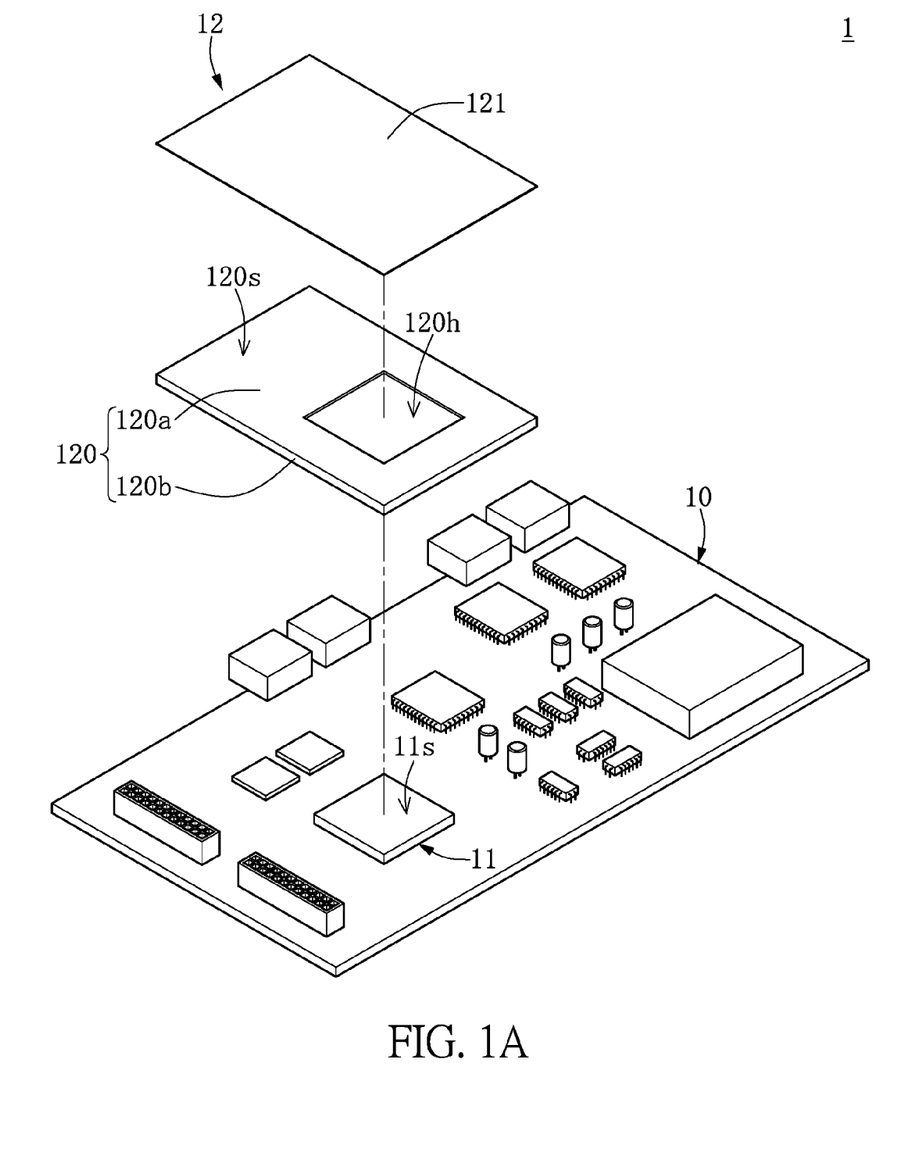
FIG. 1A shows an exploded perspective view of an electronic apparatus according to an embodiment of the instant disclosure.
Figure 1B:
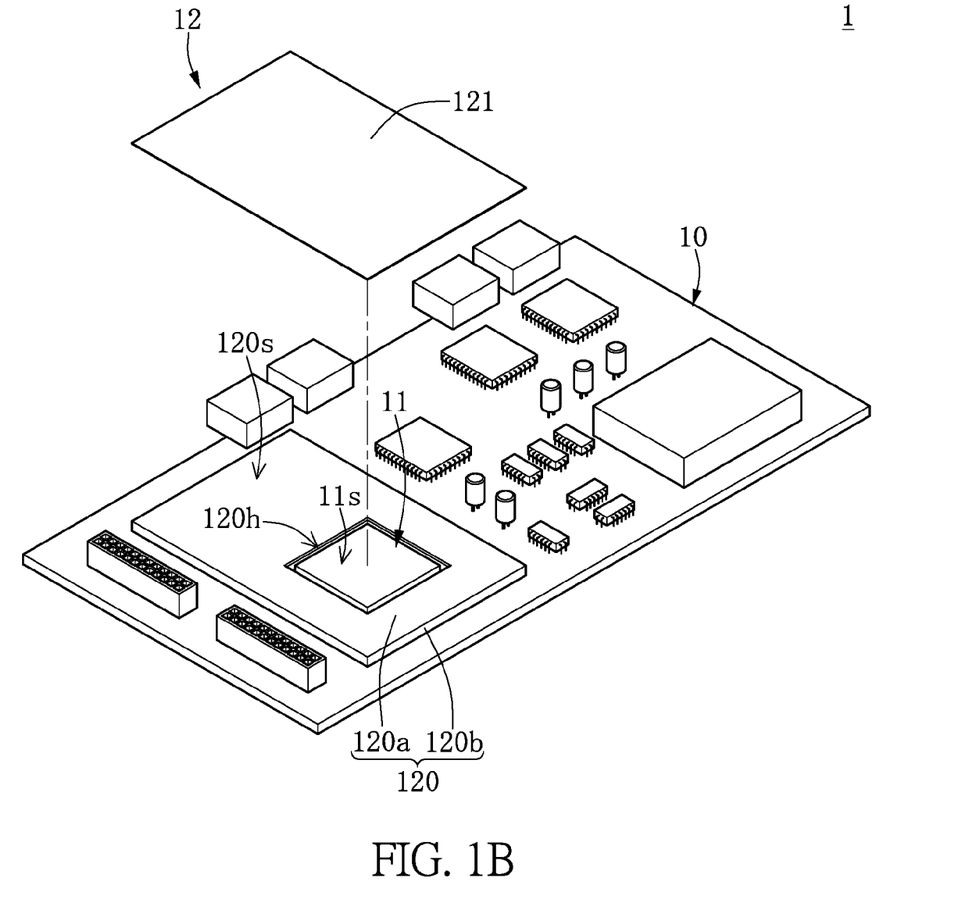
FIG. 1B shows another exploded perspective view of an electronic apparatus shown in FIG. 1A.
Figure 1C:
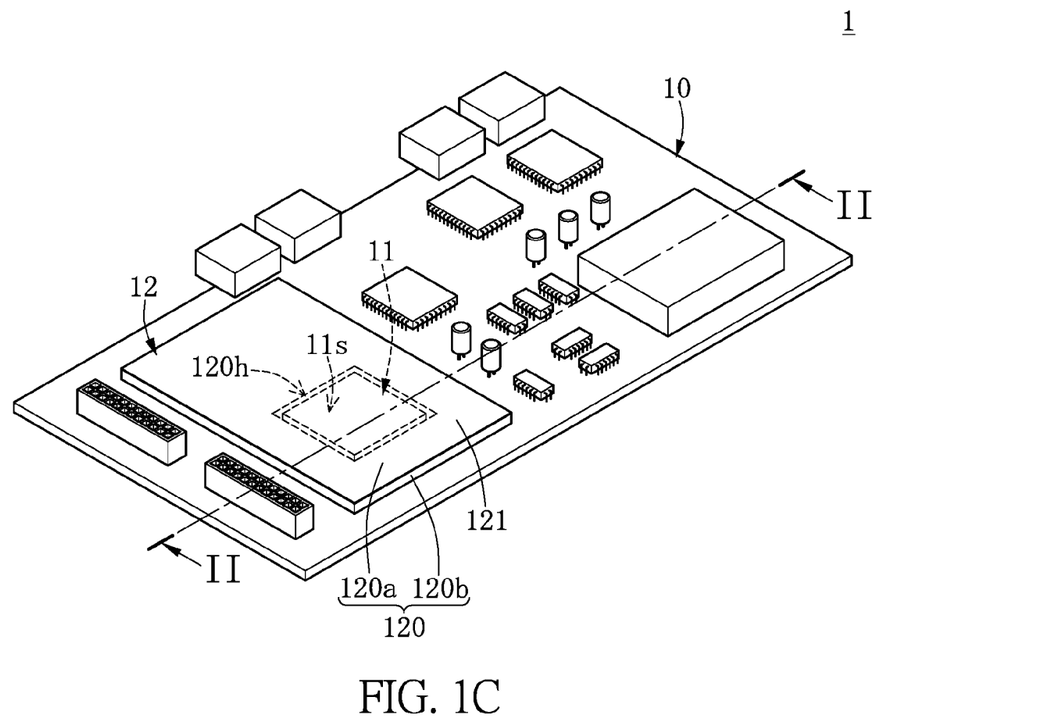
FIG. 1C shows a perspective view of the electronic apparatus shown in FIG. 1A.

Please refer to FIG. 1A, FIG. 1B and FIG. 1C. The electronic apparatus 1 includes a substrate 10, at least one chip 11 and a heat dissipation and electromagnetic interference (EMI) shielding structure 12. The electronic apparatus 1 can be a portable electronic apparatus, such as a notebook, a tablet, a smartphone, and so on.

The substrate 10 can be a printed circuit board including a plurality of traces (not shown in FIG. 1A) and a plurality of components with different functions. The components may include a control chip, a memory chip, a plurality of connecting ports, and so on. The chip 11 is disposed on the substrate 10 and electrically connected to the other components through the traces configured in the substrate 10.

The heat dissipation and EMI shielding structure 12 is adapted to dissipate heat generated by at least one chip 11 disposed on the substrate 10, protect the chip 11 from being interfered with by electromagnetic waves, and prevent the other components from being affected by the radiation generated from the chip 11. As shown in FIG. 1A, the heat dissipation and EMI shielding structure 12 includes a shielding frame 120 and a heat dissipation element 121. As shown in FIG. 1A and FIG. 1B, the shielding frame 120 is disposed on the substrate 10 and has at least one opening 120h to expose the chip 11. Specifically, the shielding frame 120 includes a top plate 120a and an enclosing sidewall 120b extending downward from an outer periphery of a surface of the top plate 120a toward the substrate 10. The opening 120h positioned at the top plate 120a extends from a top surface 120s to a lower surface (not labeled) of the top plate 120a. The size of the opening 120h corresponds to the size of the chip 11. As shown in FIG. 1B, when the shielding frame 120 is disposed on the substrate 10, the chip 11 is arranged in the opening 120h, and the enclosing sidewall 120b is in contact with the substrate 10.

In addition, the height of the top surface 120s of the top plate 120a relative to the substrate 10 is similar to the height of an upper surface 11s of the chip 11 relative to the substrate 10. That is, it is different from the conventional structures in that the shielding frame 120 has a height similar to, or even thinner than, a thickness of the chip 11.

Please refer to FIG. 1C. The heat dissipation element 121 is disposed on the shielding frame 120 to cover the opening 120h. Furthermore, the shielding frame 120 protects the chip 11 from being interfered with by electromagnetic waves in conjunction with the heat dissipation element 121, and the heat from the chip 11 can be directly dissipated by the heat dissipation element 121. In the instant embodiment, the heat dissipation element 121 completely covers the opening 120h. However, in another embodiment, the heat dissipation element 121 can partially cover the opening 120h as long as a good EMI shield can be obtained.

Figure 2:
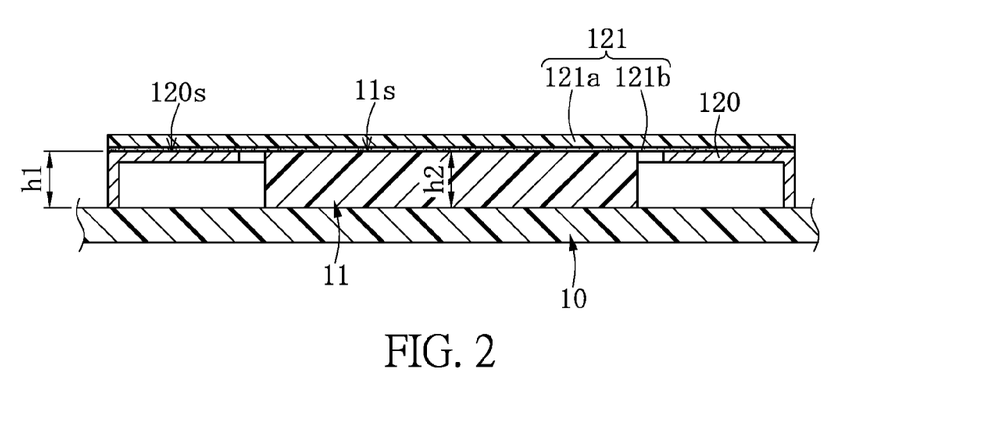
FIG. 2 shows a cross-sectional view of the electronic apparatus taken on line II-II shown in FIG. 1C.

Please refer to FIG. 2, which illustrates a cross-sectional view of the electronic apparatus taken on line II-II shown in FIG. 1C. In one embodiment, the heat dissipation element 121 includes a heat dissipation layer 121a and an adhesive layer 121b, and the heat dissipation layer 121a is fixed on the shielding frame 120 and the chip 11 through the adhesive layer 121b. The heat from the chip 11 can be conducted to the heat dissipation layer 121a through the adhesive layer 121b.

In one embodiment, the heat dissipation layer 121a is a conductive heat dissipation layer and can be made of copper, aluminum, or graphene. The adhesive layer 121b can be conductive or electrically insulative. As long as at least one of the heat dissipation layer 121a and the adhesive layer 121b is conductive, the heat dissipation element 121 can provide EMI shielding to the chip 11. In the instant embodiment, the heat dissipation layer 121a is made of graphene, and the adhesive layer 121b is electrically insulated. The heat dissipation layer 121a has a thickness of about 20 μm to about 25 μm, and the adhesive layer 12 lb has a thickness of about 10 μm.

In another embodiment, the heat dissipation layer 121a is an electrical insulating heat dissipation layer, such as a ceramic heat dissipation sheet, and the adhesive layer 121b is a curable conductive adhesive layer. In the embodiment of the instant disclosure, the thickness of the heat dissipation element 121 is thinner, ranging from about 20 μm to about 35 μm. In one embodiment, the heat dissipation element 121 is made of material in sheet form and having flexibility and ductility so that the heat dissipation element 121 can be attached to and conforming to the shape of the upper surface 11s of the chip 11.

Accordingly, even if the chip 11 may deform during the fabrication processes thereof and the deformation results in an uneven upper surface 11s, the heat dissipation element 121 can be conformingly attached to the upper surface 11s of the chip 11 through the opening 120h so that the heat generated from the center region of the chip 11 can be transferred to the outside atmosphere through the heat dissipation element 121. Compared to the conventional heat dissipation member and EMI shield, the heat dissipation and EMI shielding structure provided in the instant disclosure has higher heat dissipation efficiency.

In one experiment, the heat dissipation and EMI shielding structure 12 provided in the instant disclosure was applied to dissipate heat generated from a chip whose length and width were both 15 mm, and the heat dissipation element 121 had a length of about 62 mm and a width of about 36 mm. In the experiment, a conventional heat dissipation member and EMI shield was applied to dissipate the heat generated from the same chip. During the same time period, the experiment results showed the temperature of the chip can be lowered by 30 degrees C. through the heat dissipation and EMI shielding structure 12 provided in the instant disclosure, and the temperature of the chip was lowered by 15 degrees C. through the conventional ways. The experiment results prove the heat dissipation and EMI shielding structure 12 provided in the instant disclosure indeed has higher heat dissipation efficiency compared to the conventional structure.

Figure 3:
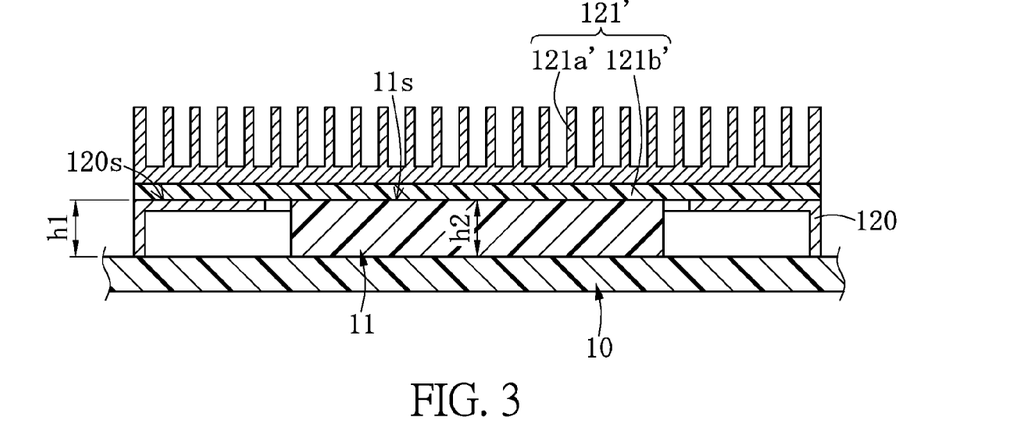
FIG. 3 shows a cross-sectional view of an electronic apparatus according to another embodiment of the instant disclosure.

Please refer to FIG. 3. FIG. 3 shows a cross-sectional view of an electronic apparatus according to another embodiment of the instant disclosure. In the embodiment shown in FIG. 3, the heat dissipation element 121' includes a heat sink 121a' and an adhesive layer 121b'. That is, after the adhesive layer 121b' is directly coated on the upper surface 11s of the chip 11 and the shielding frame 120, the heat sink 121a' is fixedly attached to the shielding frame 120 to improve the heat dissipation efficiency. The heat sink 121a' can be made by aluminum extrusion molding and the adhesive layer 121b' can be a cured with thermally conductive adhesive. In another embodiment, the heat sink 121a' also can be omitted, and the heat generated from the chip 11 only dissipated by the cured thermally conductive adhesive.

Figure 4:
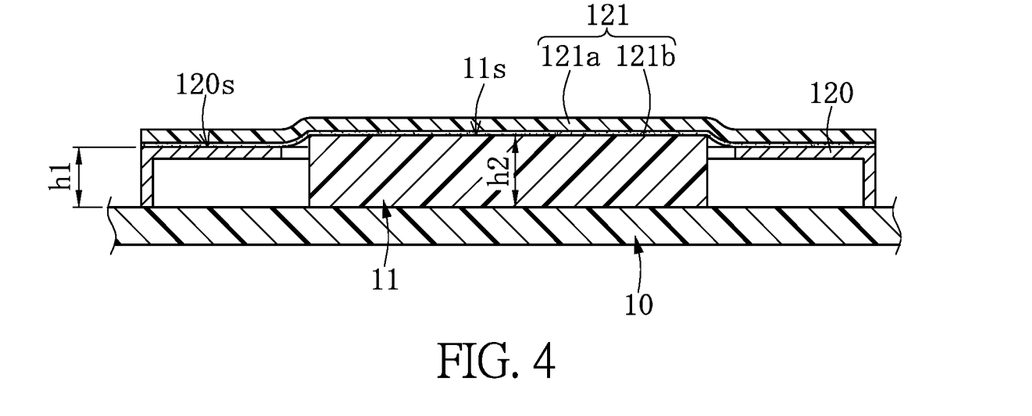
FIG. 4 shows a cross-sectional view of an electronic apparatus according to another embodiment of the instant disclosure.
Figure 5:
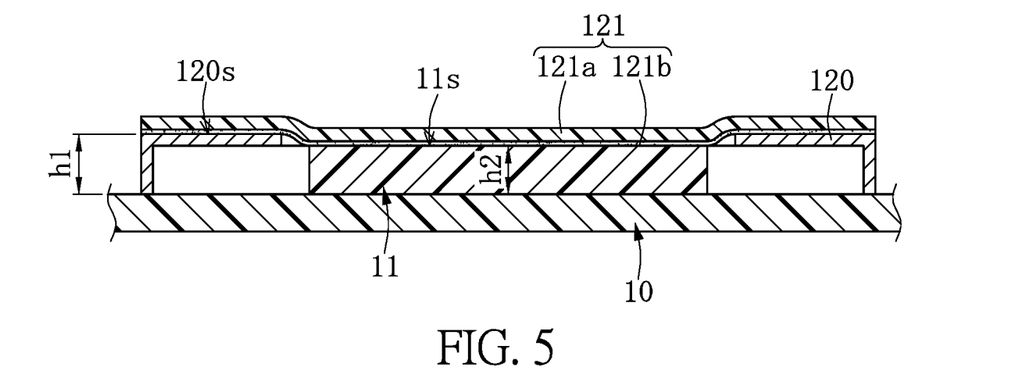
FIG. 5 shows a cross-sectional view of an electronic apparatus according to another embodiment of the instant disclosure.

Please refer to FIG. 4 and FIG. 5, which respectively show cross-sectional views of two different electronic apparatus according to other embodiments of the instant disclosure. Notably, in the embodiments shown in FIG. 2 and FIG. 3, the height h1 of the top surface 120s of the top plate 120a of the shielding frame 120 relative to the substrate 10 is substantially the same as the height h2 of the upper surface 11s of the chip 11 relative to the substrate 10. That is, the top surface 120s of the top plate 120a is coplanar with the upper surface 11s of the chip 11.

However, in the embodiment shown in FIG. 4, the height h1 of the top surface 120s of the top plate 120a of the shielding frame 120 relative to the substrate 10 is less than the height h2 of the upper surface 11s of the chip 11 relative to the substrate 10. Additionally, in the embodiment shown in FIG. 5, the height h1 of the top surface 120s of the top plate 120a of the shielding frame 120 relative to the substrate 10 is larger than the height h2 of the upper surface 11s of the chip 11 relative to the substrate 10. In the embodiments respectively shown in FIG. 4 and FIG. 5, it is preferred that the difference between the top surface 120s of the top plate 120a of the shielding frame 120 and the upper surface 11s of the chip 11 is less than 0.2 mm, which can be determined according to the ductility of the heat dissipation element 121a and the adhesive capacity of the adhesive layer 121b to ensure the heat dissipation element 121 can be smoothly adhered to the upper surface 11s of the chip 11.

To sum up, in the heat dissipation and EMI shielding structure according to the embodiment of the instant disclosure, the shielding frame has an opening formed thereon so that the heat dissipation element can be directly attached to the chip through the opening to directly dissipate the heat generated from the chip. As such, the thermally conductive silicone pad can be omitted in the heat dissipation and EMI shielding structure of the instant disclosure, and the cost of the heat dissipation and EMI shielding structure can be reduced. Additionally, because the shielding frame can have substantially the same height as that of the chip, the overall thickness of the heat dissipation and EMI shielding structure provided herein is thinner than that of the conventional structure, which provides a benefit for minimizing the size of the portable electronic product.

Furthermore, the soft and flexible adhesive layer is applied so that the heat dissipation element of the instant disclosure is fixed on the upper surface of the chip. Accordingly, even if the chip is deformed during the fabrication processes thereof, the heat dissipation element can be smoothly adhered to the center region of the chip where the heat is generated. Compared to the conventional structure, the heat dissipation and EMI shielding structure has better heat dissipation efficiency.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A heat dissipation and EMI shielding structure for at least one chip disposed on a substrate and comprising:
   a shielding frame having at least one opening to expose the chip, wherein the shielding frame includes a top plate and an enclosing sidewall extending downward from an outer periphery of a lower surface of the top plate toward the substrate: and
   a heat dissipation element disposed on the shielding frame to cover the opening, wherein the shielding frame is in conjunction with the heat dissipation element to protect the chip from electromagnetic interference, and the heat dissipation element dissipates heat generated from the chip;
   wherein the heat dissipation element includes an adhesive layer, and the adhesive layer is in contact with a top surface of the shielding frame and an upper surface of the chip; and
   wherein the heat dissipation element is in sheet form and has enough flexibility and ductility so that the heat dissipation element is capable of being attached to the chip and the shielding frame even if there is a height difference of 0.2 mm between the top surface of the top plate and the upper surface of the chip;
   wherein the height difference exists between the top surface of the top plate and the upper surface of the chip, and the heat dissipation element includes:
   a first portion in contact with the upper surface of the chip;
   a second portion connected to and surrounding the first portion; and
   a third portion in contact with the top surface of the top plate and surrounding the second portion, wherein the second portion is inclinedly connected between the first portion and the third portion.

2. The heat dissipation and EMI shielding structure according to claim 1, wherein the heat dissipation element further includes a heat dissipation layer, the heat dissipation layer is fixed on the shielding frame and the chip through the adhesive layer and has a thickness of 20 µm to 25 µm, and heat generated from the chip is conducted to the heat dissipation layer through the adhesive layer.

3. The heat dissipation and EMI shielding structure according to claim 2, wherein the heat dissipation layer is a conductive heat dissipation layer so as to protect the chip from the electromagnetic interference in conjunction with the shielding frame.

4. The heat dissipation and EMI shielding structure according to claim 3, wherein the conductive heat dissipation layer is made of copper, aluminum, or graphene.

5. The heat dissipation and EMI shielding structure according to claim 2, wherein the heat dissipation layer is an electrical insulating heat dissipation layer, the adhesive layer is a curable conductive adhesive layer so as to protect the chip from electromagnetic interference in conjunction with the shielding frame.

6. The heat dissipation and EMI shielding structure according to claim 1, wherein the heat dissipation element includes a heat sink and a cured thermally conductive adhesive, and the heat sink is attached to the shielding frame through the cured thermally conductive adhesive so as to protect the chip from electromagnetic interference in conjunction with the shielding frame.

7. The heat dissipation and EMI shielding structure according to claim 1, wherein the shielding frame is disposed on the substrate with the enclosing sidewall in contact with the substrate, and a height of the top surface of the top plate relative to a substrate surface is less than that of the upper surface of the chip relative to the substrate surface.

8. The heat dissipation and EMI shielding structure according to claim 7, wherein the heat dissipation element is attached to the top surface of the top plate and the upper surface of the chip.

9. The heat dissipation and EMI shielding structure according to claim 1, wherein the upper surface of the chip is an uneven surface, and the heat dissipation element is conformingly adhered to the upper surface of the chip.

10. An electronic apparatus comprising:
    a substrate;
    at least one chip disposed on the substrate; and
    a heat dissipation and EMI shielding structure disposed on the substrate, wherein the heat dissipation and EMI shielding structure comprises:
    a shielding frame having at least one opening to expose the chip, wherein the shielding frame includes a top plate and an enclosing sidewall extending downward from an outer periphery of a lower surface of the top plate toward the substrate; and
    a heat dissipation element disposed on the shielding frame to cover the opening, wherein the shielding frame is in conjunction with the heat dissipation element to protect the chip from electromagnetic interference, and the heat dissipation element dissipates heat generated from the chip;

wherein the heat dissipation element includes an adhesive layer, and the adhesive layer is in contact with a top surface of the shielding frame and an upper surface of the chip; and wherein the heat dissipation element is in sheet form and has enough flexibility and ductility so that the heat dissipation element is capable of being attached to the upper surface of the chip and the top surface of the shielding frame even if there is a height difference of 0.2 mm between the top surface of the top plate and the upper surface of the chip;

wherein the height difference exists between the top surface of the top plate and the upper surface of the chip, and the heat dissipation element includes:

a first portion in contact with the upper surface of the chip;

a second portion connected to and surrounding the first portion; and a third portion in contact with the top surface of the top plate and surrounding the second portion, wherein the second portion is inclinedly connected between the first portion and the third portion.

11. The electronic apparatus according to claim 10, wherein the heat dissipation element further includes a heat dissipation layer, the heat dissipation layer is fixed on the shielding frame and the chip through the adhesive layer and has a thickness of 20 μm to 25 μm, and heat generated from the chip is conducted to the heat dissipation layer through the adhesive layer.

12. The electronic apparatus according to claim 11, wherein the heat dissipation layer is a conductive heat dissipation layer so as to protect the chip from the electromagnetic interference in conjunction with the shielding frame.

13. The electronic apparatus according to claim 12, wherein the conductive heat dissipation layer is made of copper, aluminum, or graphene.

14. The electronic apparatus according to claim 11, wherein the heat dissipation layer is an electrical insulating heat dissipation layer, the adhesive layer is a curable conductive adhesive layer so as to protect the chip from electromagnetic interference in conjunction with the shielding frame.

15. The electronic apparatus according to claim 10, wherein the heat dissipation element includes a heat sink and a cured thermally conductive adhesive, and the heat sink is attached to the shielding frame through the cured thermally conductive adhesive so as to protect the chip from electromagnetic interference in conjunction with the shielding frame.

16. The electronic apparatus according to claim 10, wherein the shielding frame is disposed on the substrate with the enclosing sidewall in contact with the substrate, and a height of the top surface of the top plate relative to the substrate surface is less than that of the upper surface of the chip relative to the substrate surface.

17. The electronic apparatus according to claim 10, wherein the heat dissipation element is attached to the top surface of the top plate and the upper surface of the chip.

* * * * *